(12) United States Patent
Abe

(10) Patent No.: US 8,124,232 B2
(45) Date of Patent: Feb. 28, 2012

(54) COATED CONDUCTIVE POWDER AND CONDUCTIVE ADHESIVE USING THE SAME

(75) Inventor: Shinji Abe, Tokyo (JP)

(73) Assignee: Nippon Chemical Industrial Co., Ltd., Tokyo (JP)

( * ) Notice: Subject to any disclaimer, the term of this patent is extended or adjusted under 35 U.S.C. 154(b) by 0 days.

(21) Appl. No.: 12/738,029

(22) PCT Filed: Oct. 21, 2008

(86) PCT No.: PCT/JP2008/069068
§ 371 (c)(1),
(2), (4) Date: Apr. 14, 2010

(87) PCT Pub. No.: WO2009/054387
PCT Pub. Date: Apr. 30, 2009

(65) Prior Publication Data
US 2010/0221545 A1    Sep. 2, 2010

(30) Foreign Application Priority Data
Oct. 22, 2007   (JP) ................................. 2007-273551

(51) Int. Cl.
*B32B 5/66* (2006.01)
(52) U.S. Cl. .......................... 428/403; 428/407; 427/212
(58) Field of Classification Search .................. 428/403, 428/407; 427/212
See application file for complete search history.

(56) References Cited

U.S. PATENT DOCUMENTS

| 5,965,064 A | 10/1999 | Yamada et al. | |
|---|---|---|---|
| 6,770,369 B1 * | 8/2004 | Oyamada et al. | 428/403 |
| 2004/0109995 A1 | 6/2004 | Wakiya et al. | |
| 2006/0154070 A1 | 7/2006 | Wakiya et al. | |
| 2008/0131685 A1 | 6/2008 | Lee et al. | |

FOREIGN PATENT DOCUMENTS

| JP | 60-59070 A | 4/1985 |
|---|---|---|
| JP | 61-64882 A | 4/1986 |
| JP | 62-30855 A | 2/1987 |
| JP | 1-242782 A | 9/1989 |
| JP | 2-15176 A | 1/1990 |
| JP | 4-259766 A | 9/1992 |
| JP | 5-70750 A | 3/1993 |
| JP | 8-249922 A | 9/1996 |
| JP | 8-253745 A | 10/1996 |
| JP | 8-311655 A | 11/1996 |
| JP | 10-101962 A | 4/1998 |
| JP | 11-241054 A | 9/1999 |
| JP | 2000-243132 A | 9/2000 |
| JP | 2003-247083 A | 9/2003 |
| JP | 2004-131800 A | 4/2004 |
| JP | 2004-131801 A | 4/2004 |
| JP | 2004-197160 A | 7/2004 |
| JP | 2005-133119 A | 5/2005 |
| JP | 2007-258141 A | 10/2007 |
| JP | 2007-262495 A | 10/2007 |
| JP | 2008-117744 A | 5/2008 |
| JP | 2008-153201 A | 7/2008 |
| WO | 02/35555 A1 | 5/2002 |
| WO | 03/025955 A1 | 3/2003 |

OTHER PUBLICATIONS

International Search Report of PCT/JP2008/069068, mailing date of Feb. 24, 2009.

* cited by examiner

*Primary Examiner* — Leszek Kiliman
(74) *Attorney, Agent, or Firm* — Westerman, Hattori, Daniels & Adrian, LLP

(57) ABSTRACT

It is an object of the present invention to provide a coated conductive powder particularly useful as the conductive filler of an anisotropic conductive adhesive used for electrically interconnecting circuit boards, circuit parts, and the like, and a conductive adhesive that can provide connection with high electrical reliability even for the connection of the electrodes of miniaturized electronic parts, such as IC chips, and circuit boards. The coated conductive powder of the present invention is a coated conductive powder obtained by coating the surfaces of conductive particles with an insulating substance, wherein the insulating substance is a powdery, thermally latent curing agent. Also, in the present invention, the particle surfaces of the coated conductive powder are further coated with insulating inorganic fine particles.

9 Claims, 2 Drawing Sheets

COATED CONDUCTIVE POWDER AND CONDUCTIVE ADHESIVE USING THE SAME

TECHNICAL FIELD

The present invention relates to a coated conductive powder and a conductive adhesive, and particularly to an anisotropic conductive adhesive comprising an epoxy resin as an adhesive resin used for electrically interconnecting circuit boards, circuit parts, and the like.

BACKGROUND ART

When circuit boards, or an electronic part, such as an IC chip, and a circuit board are electrically connected, anisotropic conductive adhesives in which conductive particles are dispersed are used. These adhesives are located between opposed electrodes, and the electrodes are connected by heating and pressurization. Then, conductivity in the direction of pressurization is provided and thereby electrical connection and fixing are provided.

As the above conductive particles, for example, the use of coated conductive particles obtained by coating the surfaces of conductive particles with an insulator is proposed.

For example, the following Patent Document 1 proposes a method using coated particles obtained by substantially covering, with a thermoplastic insulating layer, particles obtained by using a polymer as a core material and forming a conductive metal thin layer on its surface. Also, the following Patent Document 2 proposes a method using microcapsule-type conductive particles obtained by forming on the surfaces of resin balls a plating layer obtained by metal plating, and uniformly coating the surface of the above plating layer with an insulating resin layer. Also, the following Patent Document 3 proposes a method using insulating coated conductive particles coated with an insulating resin insoluble in an insulating adhesive. Also, the following Patent Document 4 proposes a method using coated conductive fine particles obtained by chemically bonding coating insulating particles to particles having surfaces comprising a conductive metal via a functional group having bonding properties to the above conductive metal to form a single coating layer.

Patent Document 1: Japanese Patent Laid-Open No. 08-249922
Patent Document 2: Japanese Patent Laid-Open No. 05-70750
Patent Document 3: Japanese Patent Laid-Open No. 11-241054
Patent Document 4: International Publication No. WO2003/025955

DISCLOSURE OF THE INVENTION

Problems to be Solved by the Invention

However, when conductive particles having a coating layer incompatible with an adhesive resin is used, a problem is that the adherence at the interface between the adhesive resin and the conductive particles is low, and therefore, the layer separation and the like of the conductive particles dispersed in the adhesive resin occur easily, and the stability is low. Particularly, in the cases of an anisotropic conductive film and an anisotropic conductive adhesive using a thermosetting resin as an adhesive resin, a problem has been that the adherence at the interface between the adhesive resin and the conductive particles is low, and therefore, peeling at the interface between the adhesive resin and the coated conductive fine particles occurs after the adhesive resin is cured by thermocompression bonding, and long-term connection stability and reliability cannot be ensured. Also, in cases where for the purpose of ensuring a space between electrodes and between liquid crystal panels, conductive particles are dispersed in an adhesive resin, such as a sealing agent, and thermocompression bonding is performed, a problem has been that a resin forming the coating layer is incompatible with the adhesive resin, and therefore, the thermally melted coating resin bleeds out, contaminating the electrodes, the liquid crystals, and the like.

Also, conductive particles are added to improve the reliability of the electrical conduction of members, and particles obtained by coating elastic resin particles with metal, such as nickel and gold, are suitably used. This is for the purpose of ensuring the conduction by the elasticity of the particles against the deformation of the members due to heat and an external factor. However, when the adhesive resin component is hard, the flexibility of the conductive particles is inhibited. Therefore, there are also cases where flexibility is also required for the adhesive resin component near the conductive particles.

Also, in order to ensure reliability, the number of particles trapped on an electrode needs to be a certain number or more. However, when the curing rate is low, a problem has been that the particles flow together with the adhesive resin component due to heat, decreasing the number of trapped particles. As a measure for solving this problem, there is also a method for increasing the amount of particles added. However, in this method, a short circuit between electrodes occurs easily, and also, the cost increases. Therefore, this method is not practical.

Therefore, it is an object of the present invention to provide a coated conductive powder particularly useful as the conductive filler of an anisotropic conductive adhesive used for electrically interconnecting circuit boards, circuit parts, and the like, and a conductive adhesive that can provide connection with high electrical reliability even for the connection of the electrodes of miniaturized electronic parts, such as IC chips, and circuit boards.

Means for Solving the Problems

The above problems are solved by a coated conductive powder of a first aspect of the present invention. Specifically, the coated conductive powder provided by the first aspect of the present invention is a coated conductive powder obtained by coating the surfaces of conductive particles with an insulating substance, wherein the insulating substance is a powdery, thermally latent curing agent.

According to the first aspect of the present invention, in the coated conductive powder obtained by further coating surfaces of conductive particles with an insulating substance, the use of the powdery, thermally latent curing agent as the insulating substance can uniformly coat the conductive particles. Also, the insulating substance (powdery, thermally latent curing agent) of the obtained coated conductive powder has excellent dispersibility particularly in an epoxy resin, and therefore, the coated conductive powder itself can also be uniformly dispersed in the epoxy resin. Further, the thermally latent curing agent has the action of being solubilized in and curing the epoxy resin by heat, and does not contaminate electrodes, liquid crystals, and the like. For example, when the coated conductive powder is used as the conductive particles of an anisotropic conductive adhesive comprising an epoxy resin as an adhesive resin used for electrically interconnecting circuit boards, circuit parts, and the like, thermocompression bonding between electrodes at a temperature, at which the thermally latent curing agent is solubilized, or higher increases the adherence at the interface between the conductive powder and the adhesive resin, and long-term connection stability and reliability can be ensured. Further, the curing agent is solubilized, and therefore, the viscosity near the conductive particles can be lowered, and conduction occurs easily.

Also, in a coated conductive powder provided by a second aspect of the present invention, the surfaces of conductive particles coated with a powdery, thermally latent curing agent are further coated with insulating inorganic fine particles.

According to the second aspect of the present invention, by coating the particle surfaces of the coated conductive powder of the above first aspect with the insulating inorganic fine particles, the aggregation of the conductive particles is suppressed, and the storage stability is also excellent.

Also, a conductive adhesive provided by a third aspect of the present invention contains the coated conductive powders of the above first aspect and second aspect, and an epoxy resin.

According to the third aspect of the present invention, the use of the conductive adhesive of the present invention can provide connection with high electrical reliability even for the connection of the electrodes of miniaturized IC chips and circuit boards.

BEST MODE FOR CARRYING OUT THE INVENTION

The present invention will be described below, based on preferred embodiments thereof.

(Coated Conductive Powder of First Aspect of Present Invention)

For the conductive particles used in the coated conductive powder of the present invention, those having conductivity by themselves, such as particles of a metal of gold, silver, copper, nickel, palladium, solder, or the like, or carbon particles, or conductive particles obtained by coating the surfaces of core material particles with a conductive metal can be used.

For the size of the conductive particles, a suitable size is selected according to the specific use of the coated conductive powder of the present invention. In a case where the coated conductive powder of the present invention is used as a conductive material for connecting electronic circuits, conduction between opposed electrodes cannot occur if the particle diameter is too small, on the other hand, a short circuit between adjacent electrodes occurs if the particle diameter is too large. Therefore, particularly preferably, the average particle diameter of the conductive particles is 0.1 to 1000 μm, preferably 0.5 to 100 μm, as a value measured using an electrical resistance method.

The shape of the conductive particles is not particularly limited. Generally, the conductive particles can be of a powder particle shape, but may be of other shapes, for example, a fiber shape, a hollow shape, a plate shape, and a needle shape, or may be of a shape having many protrusions on a particle surface or an irregular shape. In the present invention, among these, a spherical shape is particularly preferred in that the coated conductive powder has excellent filling properties when used as a conductive filler.

The preferred embodiments of the conductive particles obtained by coating the surfaces of core material particles with a conductive metal will be described in more detail. As the core material particles that can be used, either an inorganic substance or an organic substance can be used without particular limitation. Examples of the core material particles of an inorganic substance include particles of metals of gold, silver, copper, nickel, palladium, solder, and the like, alloys, glass, ceramics, silica, metal or nonmetal oxide (also including hydrate), metal silicate including aluminosilicate, metal carbide, metal nitride, metal carbonate, metal sulfate, metal phosphate, metal sulfide, metal acid salt, metal halide, carbon, and the like. On the other hand, examples of the core material particles of an organic substance include natural fibers, natural resins, thermoplastic resins, such as polyethylene, polypropylene, polyvinyl chloride, polystyrene, polybutene, polyamide, polyacrylate, polyacrylonitrile, polyacetal, ionomer, and polyester, an alkyd resin, a phenolic resin, a urea resin, a benzoguanamine resin, a melamine resin, a xylene resin, a silicone resin, an epoxy resin, a diallyl phthalate resin, or the like.

The shape of the core material particles is not particularly limited. Generally, the core material particles can be of a powder particle shape, but may be of other shapes, for example, a fiber shape, a hollow shape, a plate shape, and a needle shape, or may be of a shape having many protrusions on a particle surface or an irregular shape. In the present invention, among these, a spherical shape is particularly preferred in that the coated conductive powder has excellent filling properties when used as a conductive filler.

Particularly preferably, the average particle diameter of the above core material particles is 0.1 to 1000 μm, preferably 0.5 to 100 μm. If the particle diameter is too small, conduction between opposed electrodes cannot occur even if the particles are coated with metal. On the other hand, if the particle diameter is too large, a short circuit between adjacent electrodes occurs. The average particle diameter of the core material particles is a value measured using an electrical resistance method.

Further, the particle size distribution of the core material particles measured by the above-described method has width. Generally, the width of the particle size distribution of a powder is expressed by a coefficient of variation represented by the following calculation formula (1).

coefficient of variation (%)=(standard deviation/average particle diameter)×100 calculation    formula (1)

A large coefficient of variation indicates that the distribution has width. On the other hand, a small coefficient of variation indicates that the particle size distribution is sharp. In this embodiment, core material particles with a coefficient of variation of 50% or less, particularly 30% or less, and especially 20% or less, are preferably used because there is an advantage that the rate of contribution effective for connection is high when the coated conductive powder obtained by the present invention is used as conductive particles in an anisotropic conductive film.

Other properties of the core material particles are not particularly limited. But, in the case of resin particles, those in which the value of K defined by the following formula (2);

$$K \text{ value (kgf/mm}^2\text{)}=(3/\sqrt{2}) \times F \times S^{-3/2} \times R^{-1/2} \qquad (2)$$

[here, F and S shown in the calculation formula (2) are respectively a load value (kgf) and compression displacement (mm), in 10% compressive deformation of the microspheres, as measured by a micro-compression tester MCTM-500 manufactured by SHIMADZU CORPORATION), and R is the radius (mm) of the microspheres] is in the range of 10 kgf/mm$^2$ to 10000 kgf/mm$^2$ at 20° C., and in which the recovery rate after the 10% compressive deformation is in the range of 1% to 100% at 20° C. are preferred in that when electrodes are pressure bonded to each other, the coated conductive powder can be brought into sufficient contact with the electrodes, without damaging the electrodes.

Dry methods, such as a vapor deposition method, a sputtering method, a mechanochemical method, and the use of hybridization treatment, wet methods, such as an electrolytic plating method and an electroless plating method, or methods combining these can be used as the method for coating the surfaces of the above core material particles with a conductive metal.

In the present invention, particles of metals of gold, silver, copper, nickel, palladium, solder, and the like, or conductive particles obtained by coating the surfaces of core material particles with one or two or more conductive metals of gold, silver, copper, nickel, palladium, solder, and the like are preferably used for the above conductive particles. Particularly, plated conductive particles obtained by forming a metal coating on the surfaces of core material particles by electroless plating are preferred in that the particle surfaces can be coated uniformly and densely. Especially, those in which the metal coating is of gold or palladium are preferred in that the conductivity can be increased. Also, in the present invention, those using resin as the core material particles are preferred in that they have lighter specific gravity than metal powders, and therefore, they do not precipitate easily, increasing dispersion stability, and that electrical connection can be maintained by the elasticity of the resin, and the like. Alloys (for example, a nickel-phosphorus alloy and a nickel-boron alloy) of the above metal coating are also included.

The preferred embodiments of the plated conductive particles will be described in more detail.

Preferably, the thickness of the metal coating in the plated conductive particles is 0.001 to 2 μm, particularly 0.005 to 1 μm. The thickness of the metal coating can be calculated, for example, from the amount of coating metal ions added and chemical analysis.

The manufacturing history of the plated conductive particles is not particularly limited. For example, when nickel plating using an electroless method is performed, a catalyzing treatment step (1), an initial thin film forming step (2), and an electroless plating step (3) are performed. In the catalyzing treatment step (1), precious metal ions are trapped by core material particles having the ability to trap precious metal ions or provided with the ability to trap precious metal ions by surface treatment, then, the precious metal ions are reduced, and the above precious metal is supported on the surfaces of the above core material particles. The initial thin film forming step (2) is the step of dispersing and mixing the core material particles, on which the precious metal is supported, in an initial thin film forming liquid comprising nickel ions, a reducing agent, and a complexing agent, reducing the nickel ions, and forming an initial thin film of nickel on the surfaces of the core material particles. The electroless plating step (3) is the step of manufacturing a plated powder having a nickel coating on the surfaces of the core material particles by electroless plating. These steps and other metal plating methods are all publicly known (for example, see Japanese Patent Laid-Open No. 60-59070, Japanese Patent Laid-Open No. 61-64882, Japanese Patent Laid-Open No. 62-30885, Japanese Patent Laid-Open No. 01-242782, Japanese Patent Laid-Open No. 02-15176, Japanese Patent Laid-Open No. 08-176836, Japanese Patent Laid-Open No. 08-311655, Japanese Patent Laid-Open No. 10-101962, Japanese Patent Laid-Open Nos. 2000-243132, 2004-131800, 2004-131801, and 2004-197160, and the like).

In performing the above catalyzing treatment step (1), preferably, the surfaces of the core material particles have the ability to trap precious metal ions, or the core material particles are surface-modified to have the ability to trap precious metal ions. The precious metal ions are preferably palladium or silver ions. Having the ability to trap precious metal ions refers to being able to trap precious metal ions as a chelate or a salt. For example, when amino groups, imino groups, amide groups, imide groups, cyano groups, hydroxyl groups, nitrile groups, carboxyl groups, or the like are present on the surfaces of the core material particles, the surfaces of the core material particles have the ability to trap precious metal ions. When the core material particles are surface-modified to have the ability to trap precious metal ions, for example, a method described in Japanese Patent Laid-Open No. 61-64882 or Japanese Patent Laid-Open No. 2007-262495, or the like can be used.

On the other hand, the thermally latent curing agent used in the present invention is also sometimes referred to as a thermally latent curing catalyst or a thermally latent curing accelerator and is a compound that has a low ability to polymerize an epoxy group at room temperature after mixing and has the ability to polymerize an epoxy group by heating. Further, in the present invention, another feature of the thermally latent curing agent is that a powdery one is used.

For the powdery, thermally latent curing agent used in the present invention, those having the ability to cure an epoxy resin at preferably 50 to 300° C., particularly 60 to 280° C., are preferred. The use of the thermally latent curing agent having the ability to cure an epoxy resin in the above temperature range can highly disperse the coated conductive powder in the epoxy resin. Further, an anisotropic conductive adhesive containing the coated conductive powder is preferred in that the adherence at the interface between the conductive powder and the adhesive resin is high at the temperature of thermocompression bonding generally performed for conduction with electrodes, 100 to 250° C., and therefore, long-term connection stability and reliability can be ensured.

The powdery, thermally latent curing agent that can be used is a compound that is a solid insoluble in an epoxy resin at room temperature and is solubilized and functions as a curing agent by heating. Examples thereof include dicyandiamide, microcapsule-type curing agents obtained by microencapsulating curing agents, imidazole compounds solid at room temperature, and solid dispersion-type amine adduct latent curing agents, such as reaction products of amine compounds and epoxy compounds (an amine-epoxy adduct type), reaction products of amine compounds and isocyanate compounds or urea compounds (a urea adduct type), and boron trifluoride amine complexes. Among these, an amine-epoxy adduct type is particularly preferably used in that it adheres to the conductive particle metal surfaces easily and does not come off, and the like.

For the above powdery, thermally latent curing agents, commercial products can be used. Examples thereof are shown. Examples of the amine-epoxy adduct type (amine adduct type) include "AJICURE PN-23" (trade name, Ajinomoto Co., Inc.), "AJICURE PN-23J" (trade name, Ajinomoto Co., Inc.), "AJICURE PN-H" (trade name, Ajinomoto Co., Inc.), "AJICURE PN-31" (trade name, Ajinomoto Co., Inc.), "AJICURE PN-31J" (trade name, Ajinomoto Co., Inc.), "AJICURE PN-40" (trade name, Ajinomoto Co., Inc.), "AJICURE PN-40J" (trade name, Ajinomoto Co., Inc.), "AJICURE PN-50" (trade name, Ajinomoto Co., Inc.), "AJICURE MY-24" (trade name, Ajinomoto Co., Inc.), "AJICURE MY-H" (trade name, Ajinomoto Co., Inc.), "AJICURE MY-HK" (trade name, Ajinomoto Co., Inc.), "ADEKA HARDENER EH-4346S" (trade name, ADEKA CORPORATION), "ADEKA HARDENER EH-4347S" (trade name, ADEKA CORPORATION), "ADEKA HARDENER EH-4356S" (trade name, ADEKA CORPORATION), "ADEKA HARDENER EH-4357S" (trade name, ADEKA CORPORATION), "FUJICURE FXR-1020" (trade name, FUJI KASEI KOGYO CO., LTD.), "FUJICURE FXR-1030" (trade name, FUJI KASEI KOGYO CO., LTD.), "FUJICURE FXR-1081" (trade name, FUJI KASEI KOGYO CO., LTD.), and the like. Examples of a hydrazide type include "AJI-CURE VDH" (trade name, Ajinomoto Co., Inc.), "AJICURE VDH-J" (trade name, Ajinomoto Co., Inc.), "AJICURE UDH" (trade name, Ajinomoto Co., Inc.), "AJICURE UDH-J" (trade name, Ajinomoto Co., Inc.), and the like. Examples of a complex type include "AJICURE AH-123" (trade name, Ajinomoto Co., Inc.), "AJICURE AH-203" (trade name, Ajinomoto Co., Inc.), and the like. Examples of the dicyandiamide type include "AJICURE AH-154" (trade name, Ajinomoto Co., Inc.) and "AJICURE AH-162" (trade name, Ajinomoto Co., Inc.). Examples of a specially modified type include "ADEKA HARDENER EH-4339S" (trade name, ADEKA CORPORATION), "ADEKA HARDENER EH-4370S" (trade name, ADEKA CORPORATION), "ADEKA HARDENER EH-4380S" (trade name, ADEKA CORPORATION), and the like.

The powdery, thermally latent curing agent used can be used alone, or two or more types can be used in combination.

The amount of the coating powdery, thermally latent curing agent is 0.01 to 200% by weight, preferably 0.1 to 100% by weight, and further preferably 0.1 to 70% by weight, with respect to the conductive particles. The amount of the coating powdery, thermally latent curing agent in the above range can change the properties of the cured product near the particles. On the other hand, if the amount of coating is less than 0.01% by weight, the properties of the cured product near the particles are not changed and are the same as the cured product properties of the bulk. If the amount of coating is more than 95% by weight, the unreacted curing agent remains near the particles, which may affect the cured product properties. Therefore, such amounts of coating are not preferred.

The method for coating the conductive particles with the powdery, thermally latent curing agent may be either a dry method or a wet method. The dry method is performed by introducing predetermined conductive particles and a predetermined powdery, thermally latent curing agent into a mixing apparatus. For example, a high speed mixer, a super mixer, Turbo Sphere Mixer, Eirich Mixer, Henschel Mixer, Hybridization System, Nauta Mixer, a ribbon blender, a jet mill, Cosmomizer, a bead mill, a ball mill (also referred to as a pot mill), and a paint shaker can be used as the mixing apparatus. For the operating conditions for the above mixing apparatus, and the like, conditions under which the particle surfaces of the conductive particles can be uniformly coated with the powdery, thermally latent curing agent should be appropriately selected.

On the other hand, in the case of the wet method, for example, a method is preferred in which a slurry comprising predetermined conductive particles and a predetermined powdery, thermally latent curing agent is introduced, for example, into a spray dryer and is dried together with the solvent.

The coated conductive powder of the first aspect of the present invention can be obtained in this manner.
(Coated Conductive Powder of Second Aspect of Present Invention)

Further, in the present invention, coating the particle surfaces of the coated conductive powder of the above first aspect with insulating inorganic fine particles suppresses the aggregation of the particles of the coated conductive powder and can provide excellent storage stability.

For the insulating inorganic fine particles that can be used, those having a specific gravity of 5.0 g/ml or less are preferably used. The specific gravity of the insulating inorganic fine particles in the above range suppresses the coming off of the adhered insulating inorganic fine particles due to an external factor, such as slight impact. Also, the adhered inorganic fine particles can be uniformly diffused into a conductive adhesive in kneading with the adhesive. For insulating inorganic fine particles having a specific gravity less than 1.0 g/ml, the insulating inorganic fine particles can be adhered to the surfaces of the conductive particles, but the insulating inorganic fine particles are not easily mixed in subsequent kneading with resin and tend to be operationally difficult. Therefore, the specific gravity of the insulating inorganic fine particles is preferably 1.0 to 5.0 g/ml, particularly preferably 1.2 to 4.8 g/ml.

As the insulating inorganic fine particles having the above specific gravity, one or an appropriate combination of two or more of, for example, oxides, such as titanium oxide ($TiO_2$), aluminum oxide ($Al_2O_3$), silica ($SiO_2$), calcium oxide, magnesium oxide, and ferrites, hydroxides, such as calcium hydroxide, magnesium hydroxide, aluminum hydroxide, and basic magnesium carbonate, carbonates, such as calcium carbonate, magnesium carbonate, zinc carbonate, barium carbonate, dawsonite, and hydrotalcite, sulfates, such as calcium sulfate, barium sulfate, and gypsum fiber, silicates, such as calcium silicate, talc, clay, mica, montmorillonite, bentonite, activated clay, sepiolite, imogolite, and glass fiber, nitrides, such as aluminum nitride, boron nitride, and silicon nitride, and the like can be used. Among these, titanium oxide ($TiO_2$), aluminum oxide ($Al_2O_3$), and silica are preferred in terms of specific gravity, particle diameter, small effect on an epoxy resin and a curing agent, and the like. Especially, fumed silica is particularly preferred in that a dry powder having a small particle diameter is easily obtained, that no coarse particles are present, and that the dispersibility in an adhesive resin is good.

Fumed silica is generally manufactured by combusting silicon tetrachloride in an oxyhydrogen flame, and a fumed silica having a specific surface area of about 40 to 500 $m^2$/g is commercially available. AEROSIL manufactured by NIPPON AEROSIL CO., LTD., AEROSIL manufactured by Toshin Chemicals Co., Ltd., AEROSIL manufactured by Degussa, CAB-O-SIL manufactured by Cabot, and the like can be used as commercial products. In the present invention, hydrophilic or hydrophobic fumed silica can be used. Particularly, the use of hydrophobic fumed silica is preferred in that when it adheres to particles, the entire particles are made hydrophobic, and the moisture resistance is improved, and the like. The insulating inorganic fine particles are not limited to fumed silica, and those having hydrophobicity are preferably used for the above reasons.

For the insulating inorganic fine particles used, preferably, those in which the particle diameter ratio of the insulating inorganic fine particles to the coated conductive powder of the above first aspect (the insulating inorganic fine particles/the coated conductive particles) is 1/100 or less, preferably 1/200 or less, are selected and appropriately used because they can be uniformly adhered to the particle surfaces of the coated conductive powder of the above first aspect.

Insulating inorganic fine particles with the particle diameter ratio of the insulating inorganic fine particles to the conductive particles (the insulating inorganic fine particles/the coated conductive particles) in the above range are used. But, for the insulating inorganic fine particles themselves, the use of insulating inorganic fine particles in which the average particle diameter obtained by calculation using a BET method, or by a dynamic light scattering method or the like is 1 nm to 10 μm, preferably 2 nm to 1 μm, is preferred in that they can be easily adhered to the conductive particles and dispersibility can be provided.

For the amount of the coating insulating inorganic fine particles with respect to 1 g of the conductive particles, preferably, the value of a constant n shown in the following formula (3) is $4\times10^4$ to $3\times10^{10}$, preferably $1\times10^5$ to $3\times10^9$, in terms of dispersion stability. If the constant n is much less than $4\times10^4$, the amount of the insulating inorganic fine particles coating the conductive particles decreases, and the effect of improving dispersibility is not easily obtained. On the other hand, if the constant n is more than $3\times10^9$, excess insulating inorganic fine particles increase, causing an increase in viscosity, and a decrease in adhesion, mechanical strength, and the like, in kneading with a binder.

The amount of the insulating inorganic fine particles added (g) with respect to 1 g of the conductive particles $\geq n\times(r_2^3\times d_2)/(r_1^3\times d_1)\ldots$ (3)

provided that $r_1$ 100×$r_2$ n: constant $r_1$: the radius of the coated conductive particles $d_1$: the specific gravity of the coated conductive particles $r_2$: the radius of the insulating inorganic fine particles $d_2$: the specific gravity of the insulating inorganic fine particles The method for coating the particle surfaces of the coated conductive powder of the first aspect of the invention with the insulating inorganic fine particles may be either a dry method or a wet method. But, the dry method is easy in manufacturing and is industrially advantageous. Also, the dry method is particularly preferred in that in the obtained coated conductive powder of the second aspect of the invention, there is no coming off of the adhered insulating inorganic fine particles due to an external factor, such as slight impact, and that for the adhered inorganic fine particles, those easily uniformly diffused into conductive adhesive in the kneading treatment of the adhesive are obtained.

The dry method is performed by introducing predetermined conductive particles and insulating inorganic fine particles into a mixing apparatus. For example, a high speed mixer, a super mixer, Turbo Sphere Mixer, Eirich Mixer, Henschel Mixer, Nauta Mixer, a ribbon blender, a jet mill, Cosmomizer, a paint shaker, a bead mill, a ball mill, and the like can be used as the mixing apparatus. In the present invention, among these, the use of a bead mill or a ball mill (also referred to as a pot mill) is particularly preferred in that particularly when electroless plated particles coated with a powdery, thermally latent curing agent are used as the conductive particles, the peeling of the powdery, thermally latent curing agent and the metal coating, and the like are suppressed, and the insulating inorganic fine particles can be uniformly adhered to the particle surfaces, and that for the adhered insulating inorganic fine particles, those easily uniformly diffused into an anisotropic conductive adhesive in the kneading treatment of the adhesive are obtained.

For example, when a ball mill is used as the above mixing apparatus, the use of a particulate medium, such as beads, having a particle diameter of 10 mm or less, preferably 0.1 to 5 mm, is preferred in that the insulating inorganic fine particles can be uniformly adhered, and that the operability is also good. Also, for the material of the particulate medium, ceramic beads of zirconia, alumina, glass, and the like, resin balls of Teflon (registered trademark), nylon, and the like, steel balls coated with resin, such as Teflon (registered trademark) and nylon, and the like are particularly preferably used because they have suitable hardness and can prevent metal contamination. Also, when the particulate medium is housed in the container, with an apparent volume of 10 to 60%, preferably 20 to 50%, the insulating inorganic fine particles can be uniformly adhered. The number of revolutions N depends on the inner diameter of the container used. Preferably, the value of a shown in the following formula (t) is 0.4 to 0.85, more preferably 0.45 to 0.80, because the insulating inorganic fine particles can be efficiently adhered to the particle surfaces of the conductive particles coated with a powdery, thermally latent curing agent in the container.

$$N = a \times 42.3/\sqrt{D} \quad (t)$$

N: the number of revolutions [rpm]

D: the inner diameter of the ball mill container [m]

a: constant

On the other hand, in the case of the wet method, for example, a method is preferred in which a slurry comprising predetermined conductive particles and insulating inorganic fine particles is introduced into a spray dryer and is dried together with the solvent.

The coated conductive powder of the second aspect of the present invention is obtained in this manner. In the coated conductive powder of the second aspect of the present invention, the particle surfaces of the powder can be further coated with a coupling agent, such as a silane coupling agent, aluminum coupling, a titanate coupling agent, or a zirconate coupling agent, or an insulating resin, as required, within the range that the effect of the present invention is not impaired.

The coated conductive powders of the first aspect and second aspect of the present invention have a volume resistivity value of 1 Ω·cm or less, preferably 0.5 Ω·cm or less, and have excellent conductivity. Therefore, the coated conductive powders of the first aspect and second aspect of the present invention can be suitably used as the conductive filler of a conductive adhesive.

<Conductive Adhesive>

The conductive adhesive of the present invention is preferably used as an anisotropic conductive adhesive that is located between two boards, on which a conductive substrate is formed, and heated and pressurized to adhere the above conductive substrates for conduction.

The preferred embodiments of the anisotropic conductive adhesive will be described below in more detail.

The anisotropic conductive adhesive of the present invention comprises the above coated conductive powder and an epoxy resin as an adhesive resin.

For the epoxy resin, polyvalent epoxy resins having two or more epoxy groups in one molecule used as adhesive resins can be used. Specific examples of the epoxy resins include glycidyl epoxy resins obtained by reacting novolac resins, such as phenol novolak and cresol novolak, polyhydric phenols, such as bisphenol A, bisphenol F, bisphenol AD, resorcin, and bishydroxydiphenyl ether, polyhydric alcohols such as ethylene glycol, neopentyl glycol, glycerin, trimethylolpropane, and polypropylene glycol, polyamino compounds, such as ethylenediamine, triethylenetetramine, and aniline, polyvalent carboxy compounds, such as adipic acid, phthalic acid, and isophthalic acid, or the like with epichlorohydrin or 2-methylepichlorohydrin. Specific examples of the epoxy resins also include aliphatic and alicyclic epoxy resins, such as dicyclopentadiene epoxide and butadiene dimer diepoxide, and the like. These can be used alone, or two or more of these can be mixed and used.

Also, the anisotropic conductive adhesive of the present invention can contain resins, other than the epoxy resins, together as the adhesive resin, as required. Examples of other resins include a urea resin, a melamine resin, a phenolic resin, an acrylic resin, a polyurethane resin, a polyester resin, and the like. One or two or more of these can be used.

For these adhesive resins, the use of high purity products with a small amount of impurity ions (such as Na and Cl), hydrolyzable chlorine, and the like is preferred to prevent ion migration.

The amount of the coated conductive powder of the present invention used is generally 0.1 to 30 parts by weight, preferably 0.5 to 25 parts by weight, and more preferably 1 to 20 parts by weight, with respect to 100 parts by weight of the adhesive resin component. The amount of the coated conductive powder used being in the above range can suppress high connection resistance and melt viscosity, improve connection reliability, and ensure sufficient connection anisotropy.

In the anisotropic conductive adhesive according to the present invention, in addition, additives publicly known in the art can be used. Also, the amount of the additives added should be in the range of the amount publicly known in the art. Examples of other additives can include a tackifier, a reactive aid, metal oxide, a photoinitiator, a sensitizer, a curing agent, a vulcanizing agent, a degradation preventing agent, a heat-resistant additive, a thermal conduction improving agent, a softener, a colorant, various coupling agents, a metal deactivator, or the like.

Examples of the tackifier include rosin, a rosin derivative, a terpene resin, a terpene phenolic resin, a petroleum resin, a coumarone-indene resin, a styrene resin, an isoprene resin, an alkylphenol resin, a xylene resin, and the like. Examples of the reactive aid, that is, a crosslinking agent, include polyol, isocyanates, a melamine resin, a urea resin, utropins, amines, acid anhydride, peroxide, and the like.

As an epoxy resin curing agent, those having two or more active hydrogens in one molecule can be used without particular limitation. Specific examples of the epoxy resin curing agent include polyamino compounds, such as diethylenetriamine, triethylenetetramine, metaphenylenediamine, dicyandiamide, and polyamidoamine, organic acid anhydrides, such as phthalic anhydride, methyl nadic anhydride, hexahydrophthalic anhydride, and pyromellitic anhydride, novolak resins, such as phenol novolak and cresol novolak, and the like. These can be used alone, or two or more of these can be mixed and used. Also, a latent curing agent may be used according to the use and need. Examples of the latent curing agent that can be used include an imidazole type, a hydrazide type, a boron trifluoride-amine complex, sulfonium salt, amine imide, polyamine salt, dicyandiamide, and the like, and modified compounds thereof. These can be used alone or as a mixture of two or more.

The anisotropic conductive adhesive of the present invention can be generally obtained by using a manufacturing apparatus widely used among those skilled in the art, compounding the coated conductive powder of the present invention, an epoxy resin, a curing agent, and further various additives as required, and mixing the materials, in an organic solvent as required.

The anisotropic conductive adhesive according to the present invention can provide highly reliable connection also for the connection of the electrodes of miniaturized electronic parts, such as IC chips, and circuit boards. Particularly, the anisotropic conductive adhesive of the present invention can be suitably used for the connection of the electrodes of an IC tag.

EXAMPLES

The present invention will be described below by Examples, but the present invention is not limited to these Examples.

{Insulating Substance}
<Thermally Latent Curing Agent>

For the thermally latent curing agent, commercially available ones shown in the following Table 1 were used.

TABLE 1

|  | Type of powdery, thermally latent curing agent | Melting point (° C.) |
|---|---|---|
| Sample a | Dicyandiamide (DICY) | 208 |
| Sample b | Solid dispersion-type amine-epoxy adduct type PN-23J | 95 |
| Sample c | Solid dispersion-type amine-epoxy adduct type PN-31J | 109 |
| Sample d | Solid dispersion-type amine-epoxy adduct type PN-40J | 105 |
| Sample e | Solid dispersion-type amine-epoxy adduct type PN-50J | 115 |
| Sample f | Solid dispersion-type amine-epoxy adduct type MY-24J | 122 |
| Sample g | Solid dispersion-type hydrazide-epoxy adduct type VDH-J | 125 |
| Sample h | Solid dispersion-type amine-epoxy adduct type EH-4346S | 124 |
| Sample i | Solid dispersion-type amine-epoxy adduct type EH-4357S | 79 |
| Sample j | Solid dispersion-type amine-epoxy adduct type EH-4380S | 110 |
| Sample k | Solid dispersion-type amine-epoxy adduct type FXE-1020 | 124 |
| Sample l | Solid dispersion-type amine-epoxy adduct type FXR-1081 | 121 |

Notes)
The samples a to b are manufactured by Ajinomoto Fine-Techno Co., Inc. The samples h to j are manufactured by ADEKA CORPORATION. The samples k to l are manufactured by FUJI KASEI KOGYO CO., LTD.

<Insulating Inorganic Fine Particles>

For the insulating inorganic fine particles, commercially available ones shown in the following Table 2 were used.

TABLE 2

|  | Type | Average particle diameter (nm) | Specific gravity (g/ml) |
|---|---|---|---|
| Sample A | hydrophilic fumed silica | 7 | 2.2 |
| Sample B | hydrophobic fumed silica | 12 | 2.2 |

Notes)
the sample A; hydrophilic fumed silica; manufactured by NIPPON AEROSIL CO., LTD., trade name (AEROSIL 300), the sample B; hydrophobic fumed silica; manufactured by NIPPON AEROSIL CO., LTD., trade name (AEROSIL RY200)

{Conductive Particles}
<Preparation of Gold-Plated Conductive Particles>

100 g of spherical nickel particles were stirred in an aqueous solution of 50 ml/l hydrochloric acid for 5 minutes. The mixture was filtered, and the nickel powder was repulp-washed with water once, and added, with stirring, to 1 liter of a mixed aqueous solution at a liquid temperature of 60° C. prepared with a composition of EDTA-4Na (10 g/l) and citric acid-2Na (10 g/l) at pH 6. Then, a mixed aqueous solution (liquid A) of potassium gold cyanide (10 g/l, 6.8 g/l Au), EDTA-4Na (10 g/l), and citric acid-2Na (10 g/l), and a mixed aqueous solution (liquid B) of potassium borohydride (30 g/l) and sodium hydroxide (60 g/l) were added individually and simultaneously through a feed pump for 20 minutes. At this time, the amount of the liquid A added was 120 ml, and the amount of the liquid B was 120 ml.

<Preparation of Nickel-Gold-Plated Conductive Particles>

(1) Catalyzing Treatment Step 200 milliliters of an aqueous solution of stannous chloride was introduced into 200 milliliters of a slurry comprising 7.5 parts by weight of a benzoguanamine resin. The concentration of this aqueous solution was $5 \times 10^{-3}$ moles/liter. They were stirred at room temperature for 5 minutes to perform sensitization treatment in which tin ions were adsorbed on the surfaces of the core material powders. Then, the aqueous solution was filtered, and the core material particles were repulp-washed with water once. Then, 400 milliliters of a slurry of the core material particles was made and maintained at 60° C. While the slurry was stirred using ultrasonic waves together, 2 milliliters of an aqueous solution of 0.11 mol g/liter palladium chloride was added. The stirring state as it is was maintained for 5 minutes to perform activation treatment in which palladium ions are trapped on the surfaces of the core material powders. Then, the aqueous solution was filtered. The core material powders were repulp-washed with hot water once, and 200 milliliters of a slurry of the core material powders was made. This slurry was stirred using ultrasonic waves together, and 20 milliliters of a mixed aqueous solution of 0.017 moles/liter dimethylamine borane and 0.16 moles/liter boric acid was added to the slurry. The slurry was stirred, using ultrasonic waves together, at room temperature for 2 minutes to perform palladium ion reduction treatment.

(2) Initial Thin Film Forming Step 200 milliliters of the slurry obtained in the step (1) was added to an initial thin film forming liquid comprising 0.087 moles/liter sodium tartrate, 0.005 moles/liter nickel sulfate, and 0.012 moles/liter sodium hypophosphite, with stirring, to provide an aqueous suspension. The temperature of the initial thin film forming liquid was increased to 75° C., and the amount of the liquid was 1.0 liter. Immediately after the introduction of the slurry, the production of hydrogen was noted, and the start of initial thin film formation was confirmed.

(3) Electroless Plating Step

Two liquids, a nickel ion containing liquid comprising 0.86 moles/liter nickel sulfate and 0.17 moles/liter sodium tartrate and a reducing agent containing liquid comprising 2.57 moles/liter sodium hypophosphite and 2.6 moles/liter sodium hydroxide, were added to the aqueous suspension obtained in the initial thin film forming step at an addition rate of 8 milliliters/minute. The amount of the liquids added was adjusted so that the deposited film thickness was 0.2 microns. Immediately after the addition of the two liquids, the production of hydrogen was noted, and the start of plating reaction was confirmed. After the addition of the two liquids was completed, stirring was continued, while the temperature of 75° C. was maintained, until the bubbling of hydrogen stopped. Then, the aqueous suspension was filtered, and the filtered material was repulp-washed three times and then dried by a vacuum dryer at 110° C. Thus, an electroless nickel-plated powder having a nickel-phosphorus alloy plating coating was obtained.

Then, 10 g of the above electroless nickel-plated particles were added, with stirring, to 750 mL of an electroless plating liquid at a liquid temperature of 60° C. with a composition of EDTA-4Na (10 g/L), citric acid-2Na (10 g/L), and potassium gold cyanide (3.2 g/L, 2.2 g/L Au), adjusted to pH 6 with an aqueous solution of sodium hydroxide, to perform plating treatment for 10 minutes. Then, 120 mL of a mixed aqueous solution of potassium gold cyanide (20 g/L, 13.7 g/L Au), EDTA-4Na (10 g/L), and citric acid-2Na (10 g/L), and 120 mL of a mixed aqueous solution of potassium borohydride (30 g/L) and sodium hydroxide (60 g/L) were separately added through a feed pump for 20 minutes. Then, the liquid was filtered, and the filtered material was repulp-washed three times and then dried at a temperature of 100° C. by the vacuum dryer to perform gold plating coating treatment on the nickel plating coating of the spherical core material particles.

[Thickness of Plating Coating]

The plated powder was immersed in nitric acid to dissolve the plating coating. The coating component was quantified by ICP or chemical analysis, and the thickness was calculated by the following formula.

$$A=[(r+t)^3-r^3]d_1/rd_2$$

$$A=W/100-W$$

In the formula, r represents the radius (μm) of the core material particles, t represents the thickness (μm) of the plating coating, $d_1$ represents the specific gravity of the plating coating, $d_2$ represents the specific gravity of the core material particles, and W represents metal content (% by weight).

TABLE 3

| | | Properties of core material | | | Plating coating thickness | |
|---|---|---|---|---|---|---|
| | Type of core material | Average particle diameter μm | Specific gravity g/ml | Coefficient of variation (%) | Ni plating coating μm | Au plating coating μm |
| Sample 1 | Spherical nickel | 6 | 9 | 14 | — | 24 |
| Sample 2 | Spherical benzoguanamine resin | 4.6 | 3.5 | 2.5 | 56 | 24 |

Examples 1 to 13

A powdery, thermally latent curing agent sample and a conductive particle sample were weighed in amounts shown in Table 4, and placed and sealed in a cylindrical container (pot mill) having an internal capacity of 1 L, together with 1000 parts by weight of zirconia balls having a diameter of 2 mm, and the cylindrical container was rotated at 100 rpm. The treatment was performed for 5 hours so that the powdery, thermally latent curing agent uniformly adhered to the conductive particles, and then, the zirconia balls and the obtained coated conductive powder were separated.

The particle surfaces of each of the obtained coated conductive powders were observed in a scanning electron microscope photograph. It was confirmed that the thermally latent curing agent uniformly adhered to the entire surfaces of the conductive particles. The SEM photograph of the coated conductive powder in Example 2 is shown in FIG. 1.

TABLE 4

| | Powdery, thermally latent curing agent | | Conductive particles | |
|---|---|---|---|---|
| | Type | Compounded amount (parts by weight) | Type | Compounded amount (parts by weight) |
| Example 1 | Sample a | 10 | Sample 1 | 20 |
| Example 2 | Sample b | 10 | Sample 2 | 20 |
| Example 3 | Sample c | 10 | Sample 2 | 20 |
| Example 4 | Sample d | 10 | Sample 2 | 20 |
| Example 5 | Sample e | 10 | Sample 2 | 20 |
| Example 6 | Sample f | 10 | Sample 2 | 20 |
| Example 7 | Sample g | 15 | Sample 2 | 20 |
| Example 8 | Sample h | 10 | Sample 2 | 20 |
| Example 9 | Sample i | 15 | Sample 2 | 20 |
| Example 10 | Sample j | 15 | Sample 2 | 20 |
| Example 11 | Sample k | 10 | Sample 2 | 20 |
| Example 12 | Sample l | 10 | Sample 2 | 20 |
| Example 13 | Sample b | 5 | Sample 2 | 20 |
| | Sample f | 5 | | |

Examples 14 to 26

A powdery, thermally latent curing agent sample and a conductive particle sample were weighed in amounts shown in Table 5, and placed in a container having a diameter of 100 mm, together with 500 parts by weight of Teflon (registered trademark) balls having a diameter of 20 mm and 120 parts by weight of toluene. While the temperature was maintained at 70° C., the materials were stirred at a peripheral speed of 1.52 m/s. By maintaining the temperature at 70° C., the toluene evaporated gradually, and all the toluene evaporated in 45 minutes. After the completion of the evaporation, the treatment was further continued for 30 minutes, and the Teflon (registered trademark) balls and the obtained coated conductive powder were separated.

The particle surfaces of each of the obtained coated conductive powders were observed in a scanning electron microscope photograph. It was confirmed that the thermally latent curing agent uniformly adhered to the entire surfaces of the conductive particles. The SEM photograph of the coated conductive powder in Example 15 is shown in FIG. 2.

TABLE 5

| | Powdery, thermally latent curing agent | | Conductive particles | |
|---|---|---|---|---|
| | Type | Compounded amount (parts by weight) | Type | Compounded amount (parts by weight) |
| Example 14 | Sample a | 2 | Sample 1 | 20 |
| Example 15 | Sample b | 2 | Sample 2 | 20 |
| Example 16 | Sample c | 2 | Sample 2 | 20 |
| Example 17 | Sample d | 2 | Sample 2 | 20 |
| Example 18 | Sample e | 2 | Sample 2 | 20 |

TABLE 5-continued

| | Powdery, thermally latent curing agent | | Conductive particles | |
|---|---|---|---|---|
| | Type | Compounded amount (parts by weight) | Type | Compounded amount (parts by weight) |
| Example 19 | Sample f | 2 | Sample 2 | 20 |
| Example 20 | Sample g | 4 | Sample 2 | 20 |
| Example 21 | Sample h | 2 | Sample 2 | 20 |
| Example 22 | Sample i | 4 | Sample 2 | 20 |
| Example 23 | Sample j | 4 | Sample 2 | 20 |
| Example 24 | Sample k | 2 | Sample 2 | 20 |
| Example 25 | Sample l | 2 | Sample 2 | 20 |
| Example 26 | Sample b | 1 | Sample 2 | 20 |
| | Sample f | 1 | | |

Examples 27 to 34

The coated conductive powders in the above Examples 1 to 2 and an insulating inorganic fine particle sample in an amount shown in Table 6, and further zirconia balls (particle diameter; 1 mm) having an apparent volume of 0.3 L were placed and sealed in a cylindrical container (pot mill) having an internal capacity of 0.7 L and an inner diameter of 0.09 m, and the cylindrical container was rotated at 100 rpm. The number of revolutions at this time was obtained by the following formula (t) in which a is 0.71. The treatment was performed for 60 minutes so that the insulating inorganic fine particles uniformly adhered to the conductive particles, and then, the zirconia balls and the obtained coated conductive powder were separated.

$$N = a \times 42.3/\sqrt{D} \quad (t)$$

N: the number of revolutions [rpm]
D: the inner diameter of the ball mill container [m]
a: constant The particle surfaces of each of the obtained coated conductive powders were observed in a scanning electron microscope photograph. It was confirmed that the insulating inorganic fine particles uniformly adhered to the entire surfaces of the conductive particles.

TABLE 6

| | Coated conductive powder | | Insulating inorganic fine particles | |
|---|---|---|---|---|
| | Type | Compounded amount (parts by weight) | Type | Compounded amount (parts by weight) |
| Example 27 | Example 2 | 20 | Sample A | 0.5 |
| Example 28 | Example 2 | 20 | Sample B | 1 |
| Example 29 | Example 8 | 20 | Sample A | 2 |
| Example 30 | Example 8 | 20 | Sample B | 2 |
| Example 31 | Example 15 | 20 | Sample A | 2 |
| Example 32 | Example 15 | 20 | Sample B | 2 |
| Example 33 | Example 21 | 20 | Sample A | 2 |
| Example 34 | Example 21 | 20 | Sample B | 2 |

(Measurement of Volume Resistivity Value)

The coated conductive powders in Examples 1 to 34 were subjected to heat treatment at 210° C. for 15 minutes. It was confirmed that the thermally latent curing agents were liquefied by heating. Using the coated conductive powder after the heat treatment, 1.0 g of the sample treated as described above or the sample before the treatment was placed in a vertically standing resin cylinder having an inner diameter of 10 mm, and the electrical resistance between upper and lower electrodes was measured, with a 10 kg load applied, to obtain the volume resistivity value. The results are shown in Table 7. The volume resistivity values of the conductive particle samples not coated with the thermally latent curing agents were also obtained and shown together in Table 7.

TABLE 7

| | Volume resistivity value ($\Omega \cdot cm$) |
|---|---|
| Example 1 | $2.0 \times 10^{-2}$ |
| Example 2 | $1.0 \times 10^{-3}$ |
| Example 3 | $1.0 \times 10^{-3}$ |
| Example 4 | $1.0 \times 10^{-3}$ |
| Example 5 | $1.0 \times 10^{-3}$ |
| Example 6 | $1.0 \times 10^{-3}$ |
| Example 7 | $1.0 \times 10^{-3}$ |
| Example 8 | $1.0 \times 10^{-3}$ |
| Example 9 | $1.0 \times 10^{-3}$ |
| Example 10 | $1.0 \times 10^{-3}$ |
| Example 11 | $1.0 \times 10^{-3}$ |
| Example 12 | $1.0 \times 10^{-3}$ |
| Example 13 | $1.0 \times 10^{-3}$ |
| Example 14 | $2.0 \times 10^{-2}$ |
| Example 15 | $1.0 \times 10^{-3}$ |
| Example 16 | $1.0 \times 10^{-3}$ |
| Example 17 | $1.0 \times 10^{-3}$ |
| Example 18 | $1.0 \times 10^{-3}$ |
| Example 19 | $1.0 \times 10^{-3}$ |
| Example 20 | $1.0 \times 10^{-3}$ |
| Example 21 | $1.0 \times 10^{-3}$ |
| Example 22 | $1.0 \times 10^{-3}$ |
| Example 23 | $1.0 \times 10^{-3}$ |
| Example 24 | $1.0 \times 10^{-3}$ |
| Example 25 | $1.0 \times 10^{-3}$ |
| Example 26 | $1.0 \times 10^{-3}$ |
| Example 27 | $1.0 \times 10^{-3}$ |
| Example 28 | $1.0 \times 10^{-3}$ |
| Example 29 | $1.0 \times 10^{-3}$ |
| Example 30 | $1.0 \times 10^{-3}$ |
| Example 31 | $1.0 \times 10^{-3}$ |
| Example 32 | $1.0 \times 10^{-3}$ |
| Example 33 | $1.0 \times 10^{-3}$ |
| Example 34 | $1.0 \times 10^{-3}$ |
| Conductive particle sample 1 | $2.0 \times 10^{-2}$ |
| Conductive particle sample 2 | $1.0 \times 10^{-3}$ |

From the results in Table 7, the coated conductive powders of the present invention also had good electrical conductivity, and maintained good conduction performance without increasing the resistance value, after the thermally latent curing agents liquefied.

(2) Dispersibility Test
(Preparation of Conductive Adhesives)

Using the coated conductive powders in Examples 1 to 34 before and after the treatment at 60° C. and 95% RH for 1000 hours, about 3 to 15 weight of the coated conductive powder or the conductive particles such that three hundred millions of the coated conductive powder particles or the conductive particles/cm$^3$ were present in a resin, 100 parts by weight of an epoxy main agent, JER828 (manufactured by Japan Epoxy Resins Co., Ltd.), 8 parts by weight of a curing agent, dicyandiamide (DICY), and 2 parts by weight of a curing accelerator, 2-ethyl-4-methylimidazole (2E4MZ) were kneaded by a planetary stirrer to obtain a paste.

(Dispersibility Evaluation)

The paste was applied with a film thickness of 100 µm by an applicator. A 10 cm$^2$ area of the paste was observed by a scanning electron microscope at 200×, and the number of aggregates having a major axis of 10 µm or more was measured. The results are shown in Table 8. Symbols in the Table indicate the following.

"⊚" indicates that there are no aggregate particles. "◯" indicates that one to two aggregate particles are present. "x" indicates that three or more aggregate particles are present.

TABLE 8

| | Presence or absence of 10 µm or more aggregate particles | |
|---|---|---|
| | Before treatment | After treatment |
| Example 1~13 | ⊚ | ◯ |
| Example 14~26 | ⊚ | ◯ |
| Example 27~34 | ⊚ | ⊚ |

From the results in Table 8, those obtained by further coating the particle surfaces of the coated conductive powders with fumed silica in Examples 27 to 34 were in a good dispersed state even after the treatment at 60° C. and 95% RH for 1000 hours.

(3) Mounting Evaluation
(Fabrication of IC Tags)

5 parts by weight of Examples 2, 8, 13, 28 and 33, and the conductive particle sample 2, 100 parts by weight of JER828 (manufactured by Japan Epoxy Resins Co., Ltd.), 8 parts by weight of a curing agent, dicyandiamide (DICY), and 2 parts of a curing accelerator, 2-ethyl-4-methylimidazole (2E4MZ) were kneaded by a planetary stirrer to obtain adhesive samples.

Then, the above adhesive sample was applied, 2.5 mm long×2.5 mm wide×0.05 mm thick, on the antenna board of an IC tag in which aluminum wiring is formed on a PET film. An IC having gold bumps was placed thereon and was thermocompression bonded at 160° C. at a pressure of 2.0 N for 40 seconds to fabricate an IC tag inlay.

<Checking of Number of Trapped Particles>

The ICs were peeled off the IC tags obtained by mounting using the anisotropic conductive adhesives obtained from Examples 2 and 28 and the coated conductive particle sample 2. The number of the conductive particles trapped on the gold electrode (100 µm×100 µm) on the IC was counted using an optical microscope. The results are shown in Table 9. For the adhesives obtained from Examples 2 and 28, the number of the trapped particles on the bump increased.

TABLE 9

| | Number of trapped particles |
|---|---|
| Example 2 | 20 |
| Example 28 | 20 |
| Conductive particles sample 2 | 15 |

<Bending Test>

The IC tags obtained by mounting using the anisotropic conductive adhesive samples obtained from Examples 8, 13 and 33 and the conductive particle sample 2 were repeatedly bent over a Φ15 mm roll 200 times while being pulled at 10 N. Then, a communication test was performed. The results are shown in Table 10.

For evaluation, a case where all 10 samples can communicate was evaluated as "○," and a case where one or more of 10 samples cannot communicate was evaluated as "x."

TABLE 10

|  | Before bending test | After bending test |
|---|---|---|
| Example 8 | ○ | ○ |
| Example 13 | ○ | ○ |
| Example 33 | ○ | ○ |
| Conductive particles sample 2 | ○ | X |

From the results in Table 10, all the IC tags using the anisotropic conductive adhesives of the present invention were able to communicate even after the bending test.

INDUSTRIAL APPLICABILITY

The present invention can provide a coated conductive powder useful as the conductive filler of a conductive adhesive, particularly an anisotropic conductive adhesive, used for electrically interconnecting circuit boards, circuit parts, and the like.

Also, a conductive adhesive using the coated conductive powder of the present invention can provide connection with high electrical reliability even for the connection of the electrodes of miniaturized electronic parts, such as IC chips, and circuit boards.

Figure 1:
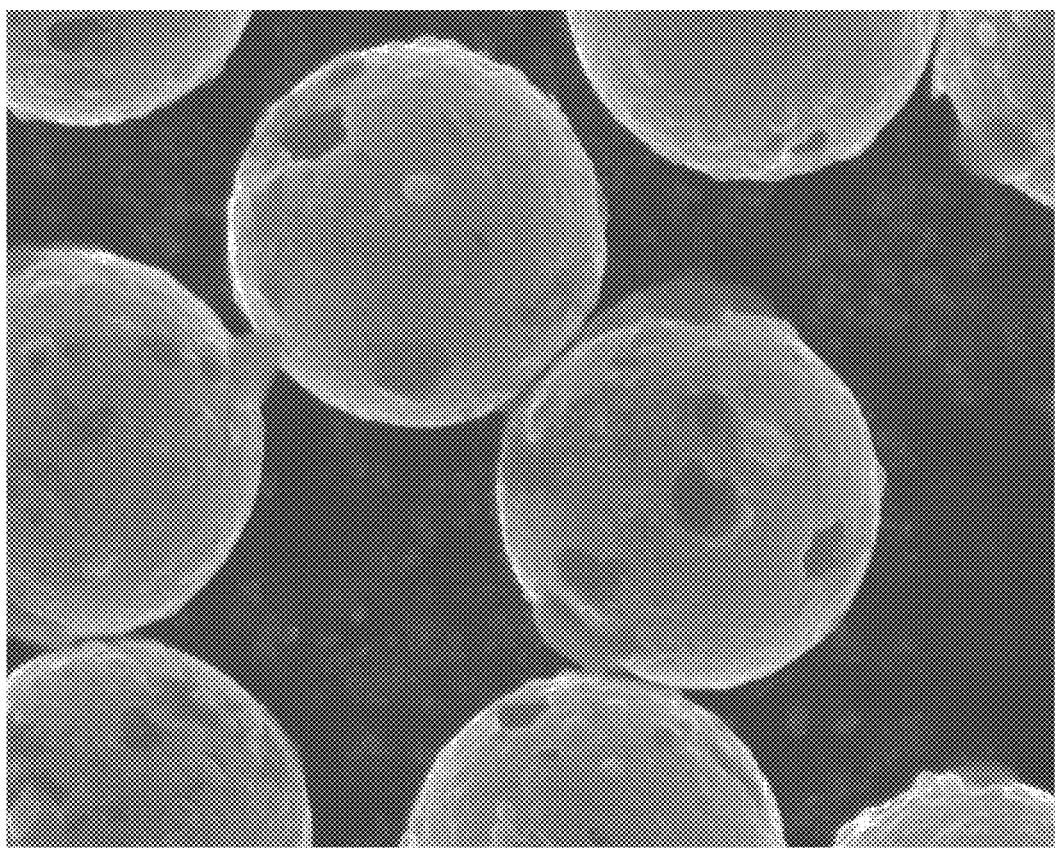
FIG. 1 is an SEM photograph showing the state of the particle surface of the coated conductive powder obtained in Example 1.
Figure 2:
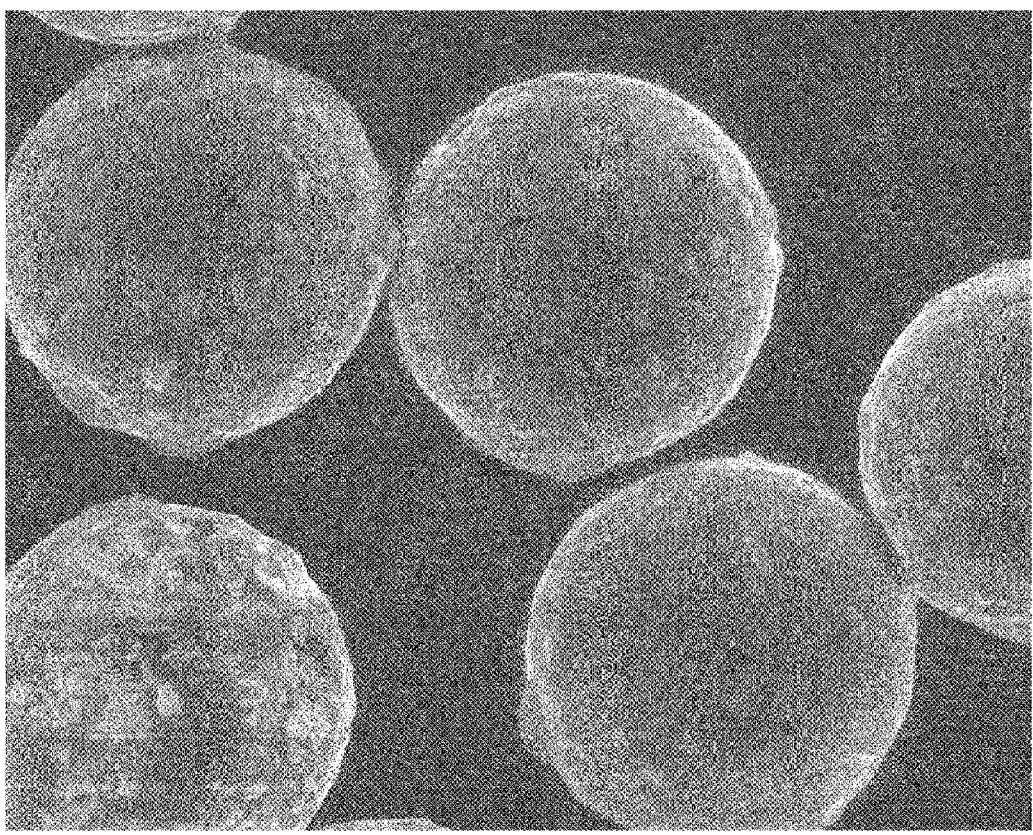
FIG. 2 is an SEM photograph showing the state of the particle surface of the coated conductive powder obtained in Example 2.

The invention claimed is:

1. A coated conductive powder comprising:
   conductive particles; and
   insulating substance coated on the surfaces of conductive particles, wherein the insulating substance is a powdery, thermally latent curing agent.

2. The coated conductive powder according to claim 1, wherein the conductive particles are plated conductive particles comprising:
   core material particles; and
   metal coating formed on the surfaces of the core material particles.

3. The coated conductive powder according to claim 2, wherein the core material is a resin.

4. A coated conductive powder wherein the surfaces of conductive particles coated with a powdery, thermally latent curing agent are further coated with insulating inorganic fine particles.

5. The coated conductive powder according to claim 4, wherein the insulating inorganic fine particles are of one or two or more selected from the group consisting of silica, titanium oxide, and aluminum oxide.

6. The coated conductive powder according to claim 4, wherein the insulating inorganic fine particles are fumed silica.

7. The coated conductive powder according to claim 6, wherein as the fumed silica, a fumed silica having hydrophobicity is used.

8. A conductive adhesive made comprising a coated conductive powder according to claim 1 and an epoxy resin.

9. The conductive adhesive according to claim 8, wherein the conductive adhesive is included in an IC tag.

* * * * *